(12) United States Patent
Urashima

(10) Patent No.: US 8,173,461 B2
(45) Date of Patent: May 8, 2012

(54) PROCESS FOR FABRICATION OF NITRIDE SEMICONDUCTOR LIGHT EMITTING DEVICE

(75) Inventor: Yasuhito Urashima, Ichihara (JP)

(73) Assignee: Showa Denko K.K., Tokyo (JP)

( * ) Notice: Subject to any disclaimer, the term of this patent is extended or adjusted under 35 U.S.C. 154(b) by 329 days.

(21) Appl. No.: 12/088,076

(22) PCT Filed: Sep. 25, 2006

(86) PCT No.: PCT/JP2006/319608
§ 371 (c)(1),
(2), (4) Date: Mar. 25, 2008

(87) PCT Pub. No.: WO2007/034998
PCT Pub. Date: Mar. 29, 2007

(65) Prior Publication Data
US 2009/0170224 A1    Jul. 2, 2009

Related U.S. Application Data

(60) Provisional application No. 60/722,443, filed on Oct. 3, 2005.

(30) Foreign Application Priority Data

Sep. 26, 2005   (JP) .................................. 2005-277119

(51) Int. Cl.
*H01L 21/00* (2006.01)

(52) U.S. Cl. ..................... 438/43; 257/98; 257/E21.578
(58) Field of Classification Search ................. 438/463, 438/68, 42–43, 666–668, 707, 713; 257/E21.578, 257/79–103
See application file for complete search history.

(56) References Cited

U.S. PATENT DOCUMENTS

| | | | |
|---|---|---|---|
| 7,190,004 B2* | 3/2007 | Nagai et al. | 257/102 |
| 2004/0235210 A1* | 11/2004 | Tamura et al. | 438/22 |
| 2005/0012109 A1* | 1/2005 | Kohno et al. | 257/103 |
| 2005/0070092 A1* | 3/2005 | Kirby | 438/637 |
| 2005/0082562 A1 | 4/2005 | Ou et al. | |
| 2005/0212091 A1* | 9/2005 | Usui et al. | 257/621 |
| 2006/0197094 A1* | 9/2006 | Sugawara | 257/79 |
| 2007/0048894 A1* | 3/2007 | Frischknecht | 438/99 |

FOREIGN PATENT DOCUMENTS

| | | |
|---|---|---|
| JP | 2002343944 A | 11/2002 |
| JP | 2003-218392 | 7/2003 |
| JP | 2003218392 A | 7/2003 |
| JP | 2004-343139 | 12/2004 |
| JP | 2005-19874 | 1/2005 |

* cited by examiner

*Primary Examiner* — Matthew W Such
*Assistant Examiner* — Ali Naraghi
(74) *Attorney, Agent, or Firm* — Sughrue Mion, PLLC

(57) ABSTRACT

The present invention relates to a process for fabrication of a nitride semiconductor light emitting device comprising a substrate, a nitride semiconductor layer on the substrate and electrodes on the nitride semiconductor, the process for fabrication of a nitride semiconductor light emitting device being characterized by device working by laser, followed by etching treatment and then electrode formation.

9 Claims, 2 Drawing Sheets

PROCESS FOR FABRICATION OF NITRIDE SEMICONDUCTOR LIGHT EMITTING DEVICE

CROSS-REFERENCES TO RELATED APPLICATIONS

This application claims benefit of Provisional Application Ser. No. 60/722,443 filed Oct. 3, 2005, incorporated herein by reference, under 35 U.S.C. 111(b) pursuant to 35 U.S.C. 119(e)(1).

TECHNICAL FIELD

The present invention relates to working of element shapes to improve the output of nitride semiconductor light emitting devices and especially light emitting diodes, and to a fabrication process that can easily optimize working conditions and increase the device yield.

BACKGROUND ART

Group III nitride semiconductors have a direct band gap of energy corresponding from the visible light range to the ultraviolet range and are capable of high efficiency light emission, and they are therefore used in products such as light emitting diodes (LED) and laser diodes (LD). In particular, the realization of white light emitting diodes by combination with fluorescent materials is anticipated as a new field of application for light emitting diodes.

The output of a light emitting diode is determined by the product of the internal quantum efficiency dependent on the epitaxial layer structure and crystallinity, and the light extraction efficiency dependent on reabsorption within the device and device shape. Several methods of working device shapes are known for increasing light extraction efficiency (Japanese Utility Model Application Publication No. 51-142870, and Japanese Unexamined Patent Publication No. 56-50586).

Output can be improved by the same principle in nitride semiconductors as well, and increased light emission output of devices can be achieved by shape working of devices in the same manner (Japanese Unexamined Patent Publication Nos. 2004-6662 and 2004-87930).

High-quality nitride semiconductors are usually grown on sapphire ($Al_2O_3$) or silicon carbide (SiC) as the substrate, using MOCVD as the growth process. Sapphire and silicon carbide are selected because they are stable substances at high temperature, and are even stable at temperatures of 1000° C.-1200° C. employed for growth of nitride semiconductors by MOCVD.

However, nitride semiconductors in devices and sapphire or SiC used as substrates are also known to be hard substances that are difficult to work, and working of devices is accomplished by laser working, dry etching with plasma or high-temperature wet etching.

Laser working involves locally heating the working site to ultrahigh temperature and accomplishing working by ablasion and vaporization. This manner of working is advantageous because of the high working speed and high throughput. A disadvantage to be considered, however, is that the sample is subjected to high temperature in proximity to the working site.

Also, the working material that has scattered by the abrasion and vaporization tends to adhere back onto the wafer, thus often requiring some sort of etching treatment after laser working.

Other methods used for etching of nitride semiconductors employ harsh working conditions, and for example, particles with energy of a few tens of eV participate in the reaction in dry etching, but in terms of temperature this corresponds to a heat energy of several hundred thousand degrees, and therefore depending on the conditions the working sections may be exposed to several 100° C. Also, since in dry etching the working is carried out in an atmosphere with a halogen such as chlorine in an excited state, other sections are also affected during working of the element at the desired sections.

Laser working and etching treatment are particularly problematic when electrodes are formed on the element. The heat generated at the worked sections causes deterioration of the electrode surfaces when they are in proximity, thereby impairing the device characteristics. In addition, the halogen used for etching causes extensive corrosion of the electrodes which are composed mainly of metal, and if the electrode is not adequately protected with a mask it can itself become etched. In device working processes after electrode formation, it is necessary to examine the intended working conditions and select the conditions in consideration of their effect, creating the problem of a narrow process window.

DISCLOSURE OF INVENTION

It is an object of the present invention to prevent device characteristic deterioration and increase device production yields by a process of laser working which has a high throughput, as means for working of device shapes, and etching as treatment after laser working.

The present invention has been accomplished on the basis of the discovery that by carrying out laser working and post-laser working etching treatment before formation of the electrodes, it is possible to avoid the effect on the electrode characteristics in the working step and increase element production yield while improving light extraction efficiency.

Specifically, the present invention consists of the following inventions.

(1) A process for fabrication of a nitride semiconductor light emitting device comprising a substrate, a nitride semiconductor layer on the substrate and electrodes on the nitride semiconductor, the process for fabrication of a nitride semiconductor light emitting device being characterized by device working by laser, followed by etching treatment and then electrode formation.

(2) A process for fabrication of a nitride semiconductor light emitting device according to (1) above, characterized in that the device working by laser accomplishes removal of at least a portion of the nitride semiconductor layer.

(3) A process for fabrication of a nitride semiconductor light emitting device according to (1) or (2) above, wherein the device working by laser accomplishes formation of grooves in the semiconductor layer of the light emitting device and/or segmenting grooves in the semiconductor layer around the perimeter of the device for isolation into individual light emitting devices.

(4) A process for fabrication of a nitride semiconductor light emitting device according to any one of (1) to (3) above, characterized in that the laser has a higher energy than the band gap energy of at least a portion of the nitride semiconductor layer.

(5) A process for fabrication of a nitride semiconductor light emitting device according to any one of (1) to (4) above, characterized in that the etching treatment is wet etching.

(6) A process for fabrication of a nitride semiconductor light emitting device according to (5) above, characterized in that the wet etching is wet etching employing orthophosphoric acid.

(7) A process for fabrication of a nitride semiconductor light emitting device according to any one of (1) to (4) above, characterized in that the etching treatment is dry etching.

(8) A process for fabrication of a nitride semiconductor light emitting device according to (7) above, characterized in that the dry etching is dry etching employing a chlorine-based gas.

(9) A process for fabrication of a nitride semiconductor light emitting device according to any one of (1) to (8) above, characterized in that alignment of laser device working by dry etching is carried out before the laser device working.

(10) A process for fabrication of a nitride semiconductor light emitting device according to any one of (1) to (9) above, characterized in that at least a portion of the surface of the nitride semiconductor layer after etching is subjected to non-mirror surface treatment.

(11) A process for fabrication of a nitride semiconductor light emitting device according to any one of (1) to (10) above, characterized in that an inclined surface is formed at the laser worked site by etching.

(12) A process for fabrication of a nitride semiconductor light emitting device according to (11) above, characterized in that at least a portion of the electrode formed on the nitride semiconductor after etching treatment is in contact with the inclined surface.

According to the invention, it is possible to accomplish device working by laser and etching without affecting the electrodes, thereby increasing the device yield. The inclined etching surface also improves the light extraction efficiency.

Figure 1:
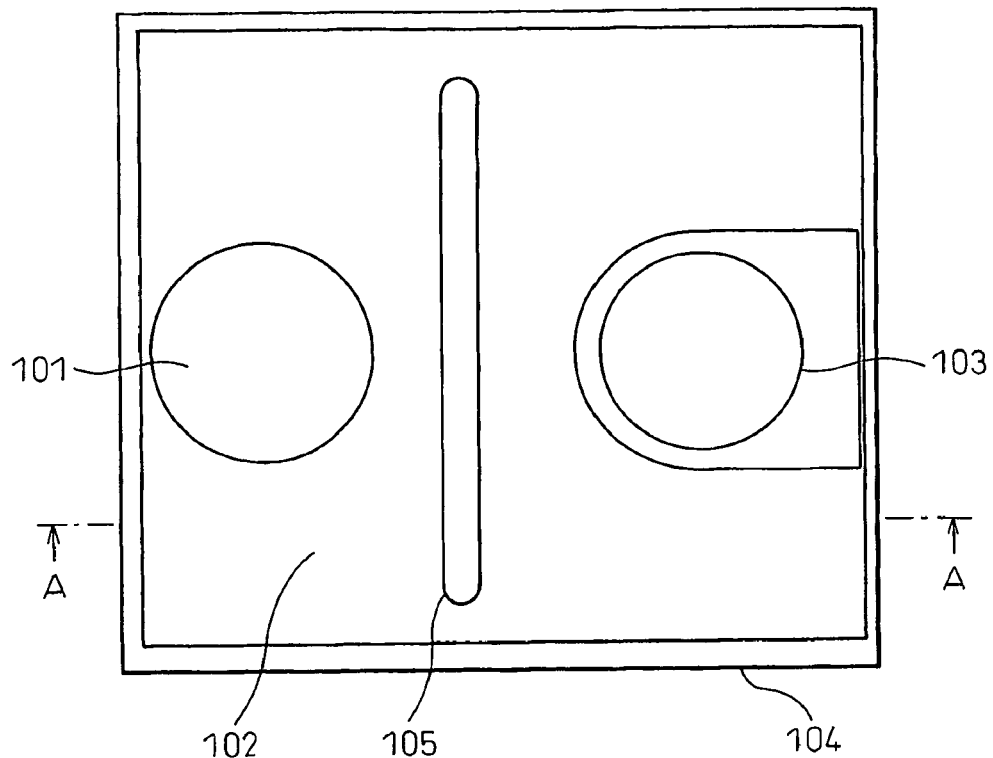
FIG. 1 is a plan view of the nitride semiconductor light emitting device fabricated in Example 1.

101: p-side pad
102: Light-permeable p-electrode
103: n-side pad
104: Individual element boundary (segmenting groove-forming section)
105: Groove
201: Substrate
202: Nitride semiconductor layer

BEST MODE FOR CARRYING OUT THE INVENTION

The substrate used for the Group III nitride (also referred to simply as "nitride") semiconductor laminate of the invention is not restricted in any way and may be a publicly known substrate material, for example, an oxide single crystal such as sapphire single crystal ($Al_2O_3$; A-surface, C-surface, M-surface, R-surface) or spinel single crystal ($MgAl_2O_4$), or a SiC single crystal. Sapphire single crystal is preferred among these. Because it has a refractive index of 1.7 which is smaller than that of the nitride semiconductor, the light extracting effect by working of the nitride semiconductor layer is increased. There are no particular restrictions on the plane direction of the substrate. It may be a just substrate or an off-angle substrate. The sapphire substrate surface may also be worked to form irregularities.

A nitride semiconductor layer comprising a first conductive layer, a light emitting layer and a second conductive layer is laminated on the substrate, under optimal conditions for each layer.

Each of the light emitting devices are fabricated by isolating the laminated semiconductor wafer into individual devices.

The invention is a process that accomplishes segmenting groove working of a semiconductor layer for device isolation or groove working of individual isolated light emitting devices from the surface toward the substrate, or a combination of segmenting groove and groove working.

After lamination of the nitride semiconductor layers, a publicly known photolithography technique is carried out to form a device isolation region and an n-electrode-forming region. This step is preferably carried out before laser working in order to achieve alignment (positioning) for working by laser, but there is no problem if it is carried out after laser working. This step may also be omitted.

For formation of the device isolation region and n-electrode-forming region, the nitride semiconductor layer on the photolithography-patterned substrate is subjected to etching by dry etching. The type of gas used for the process is usually a chlorine-based gas. Known gases include $Cl_2$, $SiCl_4$ and $BCl_3$, with mixture of $H_2$ or Ar as added gases, and combinations of these may be selected for use.

Next, a portion of the nitride semiconductor layer is removed to form device isolation segmenting grooves and/or individual device grooves. Formation of the segmenting grooves and grooves is initially accomplished by laser, and the laser wavelength is preferably a wavelength that is shorter than the absorption edge of the nitride semiconductor. The working position is limited to the laser irradiation position because of the high absorption coefficient of the nitride semiconductor. By appropriately selecting the optical system of the laser, it is possible to achieve working to a width narrower than 10 μm, and to achieve improved device yield.

If device isolation working is also carried out by laser in the step of removing a portion of the nitride layer by laser, the laser working depth preferably reaches to the substrate. If the device isolation laser working reaches to the substrate, the shape yield will be improved in the step of device isolation by breaking.

The working depth of the substrate in the isolation region (the segmenting groove depth) may be freely selected in a range of 1 μm or greater, but if the working depth is too small, shape defects will tend to occur in the subsequent segmenting treatment. A depth of 10 μm or greater will prevent defects, but a depth of 20 μm or greater is even more preferred. However, the depth does not necessarily have to reach to the substrate.

The step of forming grooves by laser removal of portions of the nitride semiconductor other than the device isolation portions may be carried out under the same conditions as in the step of removing the peripheral sections, or under different conditions. However, since shape defects tend to occur in the subsequent segmenting treatment if the working depth is too great, it is preferably carried out with reduction of the working volume by working at the peripheral sections. Generation of shape defects will be inhibited if the working volume in the substrate is such for a depth of preferably no greater than 10 μm and more preferably about 5 μm. The depth does not necessarily have to reach to the substrate.

According to the invention, etching is performed after laser working. The nitride semiconductor layer which is locally heated to ultrahigh temperature in the laser working suffers damage which can affect the device characteristics. The etching may be dry etching in a gas phase or wet etching in a liquid phase. Alternatively, both of these may be combined.

Dry etching is commonly carried out by RIE using a chlorine-based gas. The etching conditions may be the same or different conditions as for fabrication of the aforementioned device isolation region and n-electrode-forming region. The device isolation region and n-electrode-forming region may also be formed by etching after laser working.

According to the invention, the nitride semiconductor layer surface after etching may be subjected to non-mirror surface treatment.

With dry etching, it is known that the working surface can form as a non-mirror surface depending on the working conditions. For formation of a non-mirror surface on working surfaces there are known methods of forming a loose mask on the working surface and methods of using matter deposited during the etching as the mask, and any of such methods may be utilized. The amount of light extraction can be increased by forming the working surface into a non-mirror surface.

The etching solution used for wet etching may have any known composition and conditions. Mixed compositions of orthophosphoric acid or pyrophosphoric acid, phosphoric acid and sulfuric acid, and mixed compositions of ammonia and phosphoric acid, are known.

The sides of the laser worked section after etching are preferably inclined non-vertically with respect to the surface of the nitride semiconductor layer. In laser working, the optical density is high at the incident section of the crystal surface and the working volume is therefore also high, but light is attenuated inside the crystal and the working volume is reduced. Although an inclined surface is naturally formed by laser working, etching produces a greater amount of removal in regions with significant damage and therefore forms a more inclined surface.

The surface inclined in the opposite direction to the crystal surface in the main direction of light extraction acts to reinforce light irradiation in the main direction of extraction by reflection on that surface, and therefore the main direction of light extraction is preferably changed according to the orientation of the inclined surface.

The etching is followed by a step of electrode formation. An electrode forming pattern is produced by publicly known photolithography, and the electrode is formed by a technique such as vapor deposition, sputtering or plating. The n-electrode and p-electrode may be formed simultaneously or separately.

Various types of compositions and structures are known for n-electrodes, and any such known n-electrodes may be used without any restrictions whatsoever. The contact material for the n-electrode in contact with the n-contact electrode may be Al, Ti, Ni, Au or the like, or alternatively Cr, W or V. Needless to mention, the entire n-electrode may be imparted with a bonding property to form a multilayer structure. Most preferably, the outermost layer is covered with Au to facilitate bonding.

Various types of compositions and structures are also known for p-electrodes, and any such known p-electrodes may be used without any restrictions whatsoever.

The light-permeable p-electrode material may include Pt, Pd, Au, Cr, Ni, Cu, Co or the like. It is also known that a partially oxidized structure can improve the translucency.

The light-permeable p-electrode material may be a conductive oxide instead of the aforementioned metals. There may be used publicly known conductive oxides such as $In_2O_3$, ITO, ZnO, $SnO_2$ and the like. The translucent electrode may also comprise a combination of the aforementioned metals with the aforementioned oxides.

Also, a reflective p-electrode may be used instead of a translucent p-electrode. As reflective p-electrode materials there may be used, in addition to the materials mentioned above, Rh, Ag, Al and the like.

Reflection at the surface inclined in the opposite direction to the main direction of light extraction is even more effective if a high-reflection film is formed on the inclined surface. It is therefore preferred for the electrode to be formed on the inclined surface in the electrode-forming step. For example, the electrode may be formed on a portion of the inclined surface, and the electrode connected with a pad electrode.

EXAMPLES

Example 1

Examples of the invention will now be described.

Using a sapphire ($Al_2O_3$) C-surface substrate as the substrate, there were laminated thereover an undoped GaN layer to 6 μm, an n-type contact layer periodically doped with Ge to a mean carrier concentration of $1 \times 10^{19}$ $cm^{-3}$ to 4 μm, and five times in an alternating fashion a 12.5 nm n-clad layer made of $In_{0.1}Ga_{0.9}N$, a 16 nm-thick barrier layer made of GaN and a 2.5 nm-thick well layer made of $In_{0.2}Ga_{0.8}N$, via an AlN buffer according to the method disclosed in Japanese Unexamined Patent Publication No. 2003-243302, and then finally a light emitting layer having a multiple quantum well structure provided with barrier layer, a 0.05 μm-thick p-clad layer composed of Mg-doped ($8 \times 10^{19}/cm^3$ concentration) $Al_{0.2}Ga_{0.8}N$ and a 0.15 μm-thick p-contact layer composed of Mg-doped ($8 \times 10^{19}/cm^3$ concentration) $Al_{0.03}Ga_{0.97}N$ were laminated in that order to obtain a nitride semiconductor layer on the substrate.

Publicly known lithography and $Cl_2$ gas RIE were performed to expose the individual element boundary sections and a portion of the n-type contact layer C section on the surface of the nitride semiconductor layer.

A laser was then used to form segmenting grooves at the individual element boundary sections.

The working layer was used with a wavelength of 266 nm, a frequency of 50 kHz and an output of 1.6 W. The working speed was 70 mm/sec, and the grooves were formed to a depth of 20 μm in the substrate. The stage was rotated 90° to form segmenting grooves in the same manner in the Y-axis direction.

The laser output was then reduced to 0.6 W for burst mode for removal of the GaN layer between the opposing electrodes of the chips to form grooves. The oscillation timing was adjusted for a removal length of ⅔ of the chip. The substrate directly under the removed GaN layer was also removed to about 5 μm, but the volume was smaller than the segmenting grooves at the boundary sections.

The substrate after formation of the segmenting grooves was immersed for 20 minutes in a quartz beaker containing orthophosphoric acid heated to 240° C. using a heating device, to accomplish wet etching. The etching volume of the nitride semiconductor layer was 5.2 μm. The wet etched substrate and nitride semiconductor layer were washed with water in the presence of ultrasonic waves, and were then subjected to organic washing to remove the resist etching mask.

The wafer surface was coated with a resist, and the n-electrode periphery and device boundary sections were exposed by lithography. The etching gas used was $CH_2Cl_2$, and increasing the etching pressure to 2 Pa to be higher than the contact layer-forming conditions resulted in simultaneous polymer deposition and etching at the surface, thereby forming a non-mirror surface on the etching surface. After formation of the non-mirror surface, the resist was removed.

A lithography and lift-off method were used to form a light-permeable p-electrode made of Pt and Au in that order from the p-contact layer side, at a prescribed position on the p-contact layer of the compound semiconductor laminate layer. Next, publicly known lithographic and lift-off techniques were carried out to simultaneously form p-electrode and n-electrode bonding pads.

The etched substrate and nitride semiconductor layer were further polished on the substrate side to reduce the thickness to 80 μm, and then a breaking apparatus was used for segmentation into individual elements.

The output of each segmented device was 7.1 mW as evaluated with an integrating sphere. Upon observation of the device side surface by SEM, the nitride semiconductor layer side was inclined at about 40° with respect to the sapphire substrate side that had been vertically cleaved, and a reverse taper with respect to the substrate surface side (a groove with a widening substrate side) had been formed.

Example 2

This example was carried out using different conditions.

Growth of the nitride semiconductor layer on the substrate was carried out under the same conditions as Example 1. In this example, laser working for device isolation was carried out first.

The working laser conditions were the same as in Example 1, for formation of segmenting grooves in the X-axis and Y-axis directions.

Figure 2:
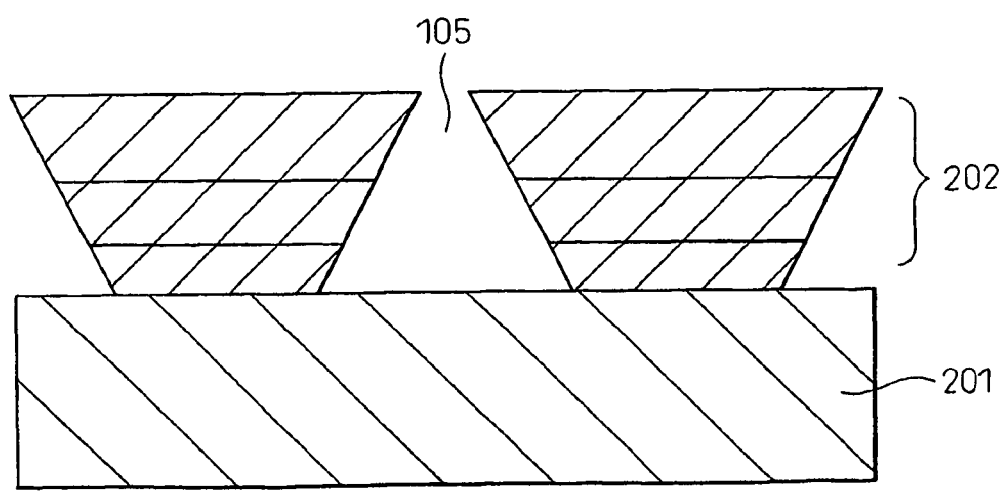
FIG. 2 is a cross-sectional view along A-A of the light emitting device of FIG. 1.
Figure 3:
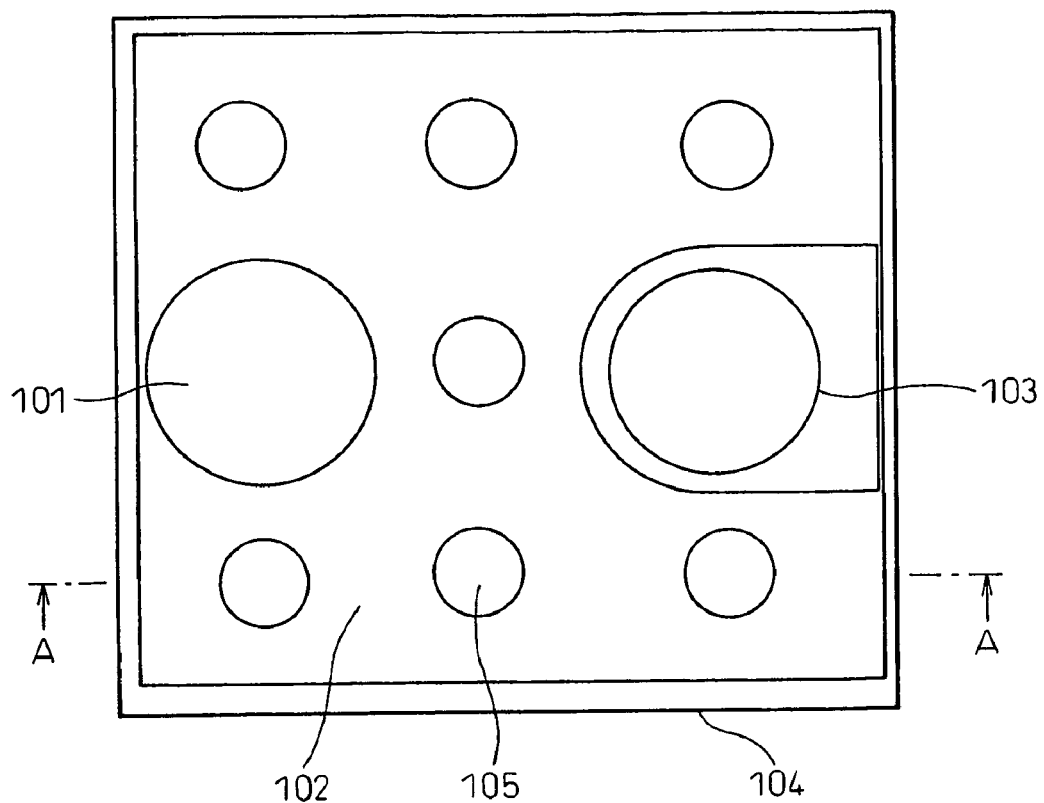
FIG. 3 is a plan view of the nitride semiconductor light emitting device fabricated in Example 2.
Figure 4:
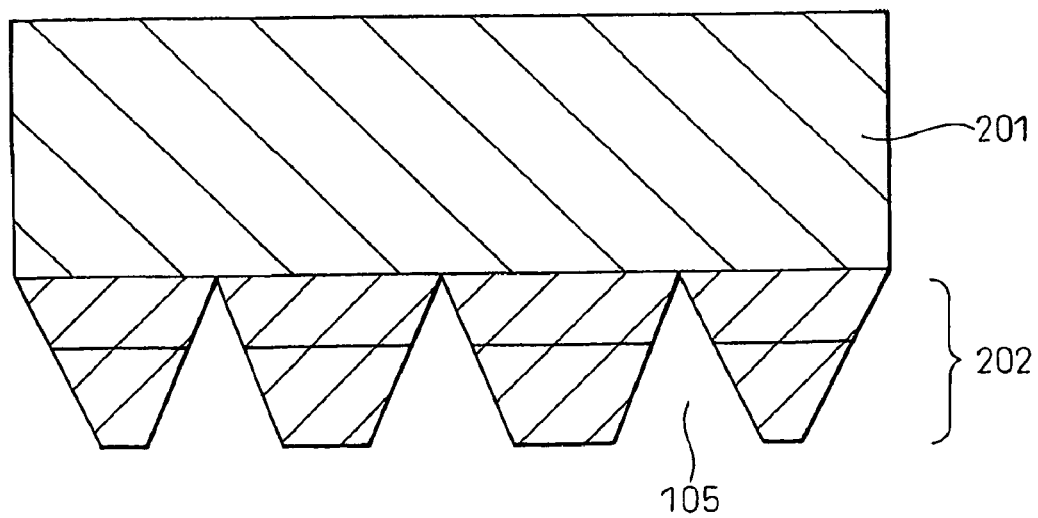
FIG. 4 is a cross-sectional view along A-A of the light emitting device of FIG. 3, with the substrate side facing upward.

The laser was then used in burst mode for removal of the portions of the nitride semiconductor layer other than the isolation region in a circular fashion, as shown in FIG. 2. The sample stage was scanned at an output of 1.6 W and a speed of 30 mm/sec, and the laser was oscillated at a point matching the working position. The nitride layer was removed in the roughly circular shape of the laser beam at the irradiated sections, and a 5 μm working trace was left on the substrate under the same conditions.

The laser-worked wafer was coated with a resist. Lithography was performed using a mask which exposed the laser-worked segmenting grooves and circular section. The n-type contact-forming region was also exposed.

RIE was performed by the same n-type contact forming step and under the same conditions as in Example 1. Since the etching volume is greater at the incident side which suffers significant damage by the laser during this step, and the segmenting groove has a larger opening at the opening side of the circular section, a forward taper with respect to the nitride semiconductor layer (a groove with a narrowing substrate side) is formed. The inclination angle was approximately 30°.

A Pt reflective electrode was formed as the p-type electrode. A resist mask was formed by lithography so as to cover the circular section and n-type contact-forming region, and a Pt electrode and Au pad were formed on the exposed sections by electron beam vapor deposition. The unwanted sections of the electrode were then removed by lift-off.

In order to prevent shorting with the n-type electrode, an $SiO_2$ film was formed as an insulating layer by EB vapor deposition so as to cover the entire upper surface of the p-type electrode except for the section exposed as the p-type pad, and the exposed bonding side. Also, after using a resist mask to cover the sections where the p-type pad was to be exposed, Al was vapor deposited over the entire surface as a reflecting electrode to form an n-type electrode. Substrate polishing and segmentation were carried out in the same manner as Example 1.

The segmented element was mounted in a TO18 system with the electrode side facing downward, and the output was evaluated as 12.2 mW with an integrating sphere. Upon observation of the element side surface by SEM, the nitride semiconductor layer side was inclined at about 30° with respect to the sapphire substrate side that had been vertically cleaved, and a reverse taper with respect to the substrate surface side had been formed.

Comparative Example

This is an example in which the electrode is formed first, for comparison.

Growth of the nitride semiconductor layer on the substrate was carried out in the same manner as Example 1.

Publicly known lithography and $Cl_2$ gas RIE were used to expose the individual element boundary sections and a portion of the n-type contact layer on the surface of the nitride semiconductor layer.

A lithography and lift-off method were used to form a translucent p-electrode made of Pt and Au in that order from the p-contact layer side, at a prescribed position on the p-contact layer of the compound semiconductor laminate layer. Next, publicly known lithographic and lift-off techniques were carried out to simultaneously form p-electrode and n-electrode bonding pads.

Laser working for formation of segmenting grooves was performed under the same conditions as Example 1.

The substrate after segmenting groove formation was subjected to wet etching under the same conditions as Example 1. The wet etched substrate and nitride semiconductor layer were washed with water in the presence of ultrasonic waves, and were then subjected to organic washing to remove the resist etching mask.

After removal of the etching mask, loss of a portion of the electrode sample due to corrosion was confirmed. Deformation of the resist mask before removal was also confirmed. The frequency of faulty electrodes was approximately 10%. The etching condition was 240° C. in Example 1, and it is assumed that this temperature caused resist mask deformation and etching solution permeation.

INDUSTRIAL APPLICABILITY

The nitride semiconductor light emitting device of the invention is subjected to shape working for increased output of light emitting diodes, using laser and low damage-producing etching, so that yield reduction by subsequent electrode formation is prevented and productivity is thereby improved.

The invention claimed is:

1. A process for fabrication of a nitride semiconductor light emitting device comprising a substrate, a nitride semiconductor layer having an upper surface on the substrate and electrodes on the nitride semiconductor, the process for fabrication of a nitride semiconductor light emitting device being characterized by device working by laser, wherein the device working by laser accomplishes formation of grooves in the semiconductor layer of the light emitting device and/or segmenting grooves in the semiconductor layer around the perimeter of the device for isolation into individual light emitting devices followed by forming an inclined surface that is a reverse taper with respect to the upper surface of the nitride semiconductor layer at the laser worked site by etching treatment and then electrode formation.

2. A process for fabrication of a nitride semiconductor light emitting device according to claim 1, characterized in that the laser has a higher energy than the band gap energy of at least a portion of the nitride semiconductor layer.

3. A process for fabrication of a nitride semiconductor light emitting device according to claim 1, characterized in that the etching treatment is wet etching.

4. A process for fabrication of a nitride semiconductor light emitting device according to claim 3, characterized in that the wet etching is wet etching employing orthophosphoric acid.

5. A process for fabrication of a nitride semiconductor light emitting device according to claim 1, characterized in that the etching treatment is dry etching.

6. A process for fabrication of a nitride semiconductor light emitting device according to claim 5, characterized in that the dry etching is dry etching employing a chlorine-based gas.

7. A process for fabrication of a nitride semiconductor light emitting device according to claim 1, characterized in that alignment of laser device working by dry etching is carried out before the laser device working.

8. A process for fabrication of a nitride semiconductor light emitting device according to claim 1, characterized in that at least a portion of the surface of the nitride semiconductor layer after etching is subjected to non-mirror surface treatment.

9. A process for fabrication of a nitride semiconductor light emitting device according to claim 1, characterized in that at least a portion of the electrode formed on the nitride semiconductor after etching treatment is in contact with the inclined surface.

* * * * *